(12) United States Patent
Volant et al.

(10) Patent No.: US 7,053,460 B2
(45) Date of Patent: May 30, 2006

(54) MULTI-LEVEL RF PASSIVE DEVICE

(75) Inventors: Richard P. Volant, New Fairfield, CT (US); Seshadri Subbanna, Brewster, NY (US); Robert A. Groves, Highland, NY (US); John C. Malinowski, Jericho, VT (US); Kenneth J. Stein, Sandy Hook, CT (US); Kevin S. Petrarca, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/026,146

(22) Filed: Dec. 21, 2001

(65) Prior Publication Data

US 2003/0116850 A1 Jun. 26, 2003

(51) Int. Cl.
*H01L 29/00* (2006.01)
*H01L 23/48* (2006.01)

(52) U.S. Cl. .................. 257/531; 257/528; 257/762
(58) Field of Classification Search ............ 257/211, 257/528, 531, 751, 752, 758, 759, 762, 774; 438/128, 129, 329, 381, 626, 627, 631, 685, 438/687, 618

See application file for complete search history.

(56) References Cited

U.S. PATENT DOCUMENTS

| | | | | |
|---|---|---|---|---|
| 4,758,896 A | * | 7/1988 | Ito .............................. | 348/790 |
| 5,861,647 A | * | 1/1999 | Zhao et al. .................. | 257/296 |
| 6,083,802 A | * | 7/2000 | Wen et al. .................... | 438/381 |
| 6,114,937 A | | 9/2000 | Burghartz et al. .......... | 336/200 |
| 6,303,423 B1 | * | 10/2001 | Lin ............................ | 438/238 |
| 6,534,374 B1 | * | 3/2003 | Johnson et al. ............. | 438/381 |

OTHER PUBLICATIONS

*VLSI Technology*, Second Edition, S. M. Sze, (Mcgraw Hill, N.Y., 1988), p. 300.

* cited by examiner

*Primary Examiner*—Hung Vu
(74) *Attorney, Agent, or Firm*—Joseph P. Abate

(57) ABSTRACT

A passive electrical device includes a first electrical conductor, a second electrical conductor disposed over the first conductor; and a third electrical conductor connecting the first conductor to the second conductor. The said first, second and third conductors are disposed on a semiconductor substrate. The sheet resistivity of the first conductor is approximately equal to the sheet resistivity of the second conductor.

12 Claims, 4 Drawing Sheets

MULTI-LEVEL RF PASSIVE DEVICE

BACKGROUND OF THE INVENTION

1. Field of the Invention

The present invention relates to passive electrical elements or devices and, more particularly, to such devices formed as part of integrated circuits.

2. Description of the Related Art

Present passive elements, such as inductors, which are integrated on chip typically suffer from high series resistance and capacitive coupling effects which reduce their Q factor. For example, spiral inductors fabricated using a thick last metal layer suffer from having underpass (from center of coil to outer connection) resistance much higher than the rest of the coil. This is due to the prior metal level, which is usually much thinner, being utilized for the underpass. Additionally, inductance density (inductance per unit area) is lower than desired when creating inductors from a single thick last metal layer, causing use of excessive chip area that cannot be used for active functions.

In prior art implementations, the stacking of inductors in series to increase the inductance density has had only limited success due to the high resistivity of the second to last metal level that is utilized to create the second spiral. In prior art implementations, the last two metal levels are also typically separated by a relatively thin dielectric, causing them to be highly capacitively coupled. Creating stacked inductors in this manner causes excessive series resistance and low self-resonance (due to the high capacitive coupling); both factors tending to limit the achievable Q for a spiral inductor.

Another application that has been difficult to achieve due to the limitations of prior art approaches is the realization of coupled inductor structures (e.g., transformers, couplers, baluns, etc.). Excessive capacitive coupling and resistance asymmetry have sometimes precluded the use of coupled inductors that are stacked on top of each other. The most common approach to realizing coupled inductors in prior art implementations, is to create interdigitated spirals on the final level of metal. This approach suffers from excessive use of chip area and from low coupling coefficients (0.7 to 0.85).

For certain prior art approaches, see, for example, U.S. Pat. No. 6,114,937, Integrated Circuit Spiral Inductor, Sep. 5, 2000, by Burghartz, et al., which is hereby incorporated in its entirety by reference.

The present inventors believe that these drawbacks in the prior art can be overcome.

SUMMARY OF THE INVENTION

The device according to the present invention includes two or more metal layers (e.g. spiral turns) disposed on a semiconductor substrate, each layer having an approximately (±10%) equal low sheet resistivity (i.e., ohms per square). See, for example, *VLSI Technology*, Second Edition, S. M. Sze, (Mcgraw Hill, N.Y., 1988), p. 300, which is incorporated herein.

According to the invention, a passive electrical device includes a first electrical conductor; a second electrical conductor disposed over the first electrical conductor; a third electrical conductor connecting the first conductor to the second conductor, wherein the first, second and third conductors are disposed on a semiconductor substrate and wherein the sheet resistivity of the first electrical conductor is approximately equal to the sheet resistivity of the second electrical conductor.

It is a principal object of the present invention to increase the Q factor of an integrated circuit inductor.

Further and still other objects of the present invention will become more readily apparent when the following detailed description is taken in conjunction with the accompanying drawings figures.

BRIEF DESCRIPTION OF THE DRAWINGS

FIG. 3 are perspective views of two spiral wound devices; FIG. 3A shows one layer according to the prior art, while

DETAILED DESCRIPTION OF THE PREFERRED EMBODIMENT AND BEST MODE

The preferred embodiment includes two or more thick (low sheet resistivity) metal layers (20,40,50) which form spiral inductors and other high Q passive elements on a substrate S, such as: transmission lines, vco's. See FIG. 1, FIG. 2 and FIG. 3B.

Figure 3A:
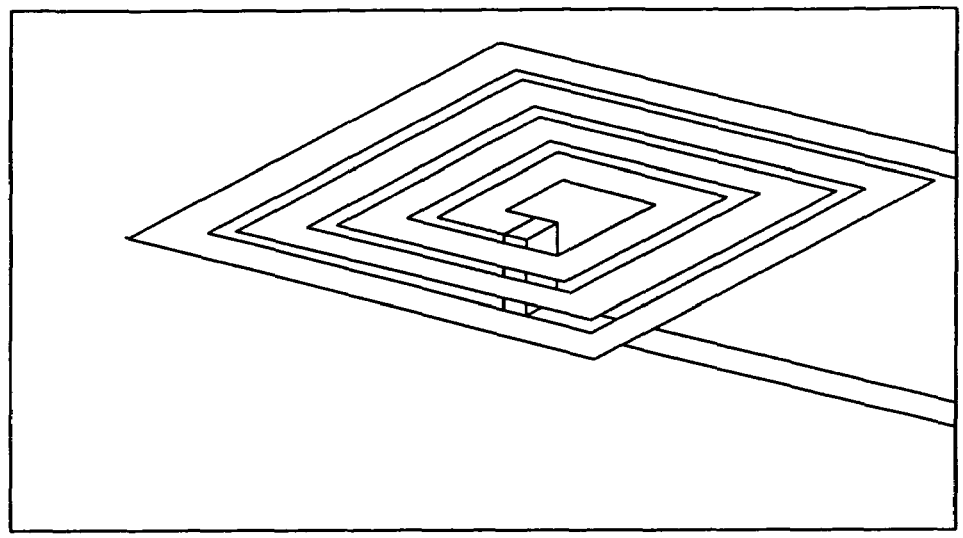

The realization of two thick metal layers, with sufficiently low sheet resistivity, that are not too heavily coupled capacitively, allows the stacking of spirals without the drawbacks of the prior art approach. Vertical series stacking of spirals (FIG. 3B) allows for an almost 4× increase in inductance density over a single level spiral (FIG. 3A). Additionally, parallel stacking of spirals to reduce the series resistance becomes more advantageous when a low sheet resistivity interlevel via 30 (e.g. copper) is used. This metal filled via 30 can be made to run continuously along the length of the upper and lower spiral, (20,40,50) providing a lower series resistance than can be achieved with a simple parallel combination of the two spiral levels alone.

The ability to stack inductor spirals effectively also permits highly efficient coupled inductor structures (with coupling coefficients on the order of 0.9). The fact that the upper and lower spirals have equivalent sheet resistivities solves the problem of resistance asymmetry present in the prior art approach. Additionally, a large vertical separation (e.g., three-four microns) between the two spirals (provided by the tall via 30) reduces the capacitive coupling that is also a problem in the prior art approach.

The thick line levels (20,40) are preferably made of Cu (with standard liners) and are from 2 microns to 32 microns thick T. Preferably, each thickness is approximately (±10%) equal for a maximum performance. The via 30 is also made of Cu and can be 2 microns to 10 microns deep.

The MT (top metal) level shown 5 can be of Al or Cu as can the lower via 10. It is preferable to make the lower via 10 as tall (thick) as possible to isolate the substrate capacitance from the passive structure. The height T of via 30 can be 2 microns to 4 microns, but can be as much as 30 microns. A preferred range is 2 microns to 10 microns.

If the MT level 5 is of Cu, then the via 10 should also be of Cu. If Al is used for MT 5, then W is used for the via 10.

Conductive layer 20 and connecting conductor 30 will preferably be made by damascene style processes to avoid topography issues, while the top layer 40 can be made either by damascene or patterned plate (raised structure) techniques. Top layer 50 (the Al layer) is made using standard substrative etch processes and is typically limited to a maximum thickness of 4 microns to 6 microns, due to the need to align thru the blanket metal and the need to RIE the metal. If Al is used for the top level 50, then it 50 should be about twice as thick as the lower level (20) to match the sheet resistivity of layer 20. Thickness can readily be calculated for any desired model of sheet resistances, as would be well known to those skilled in view of the instant disclosure.

Figure 1:
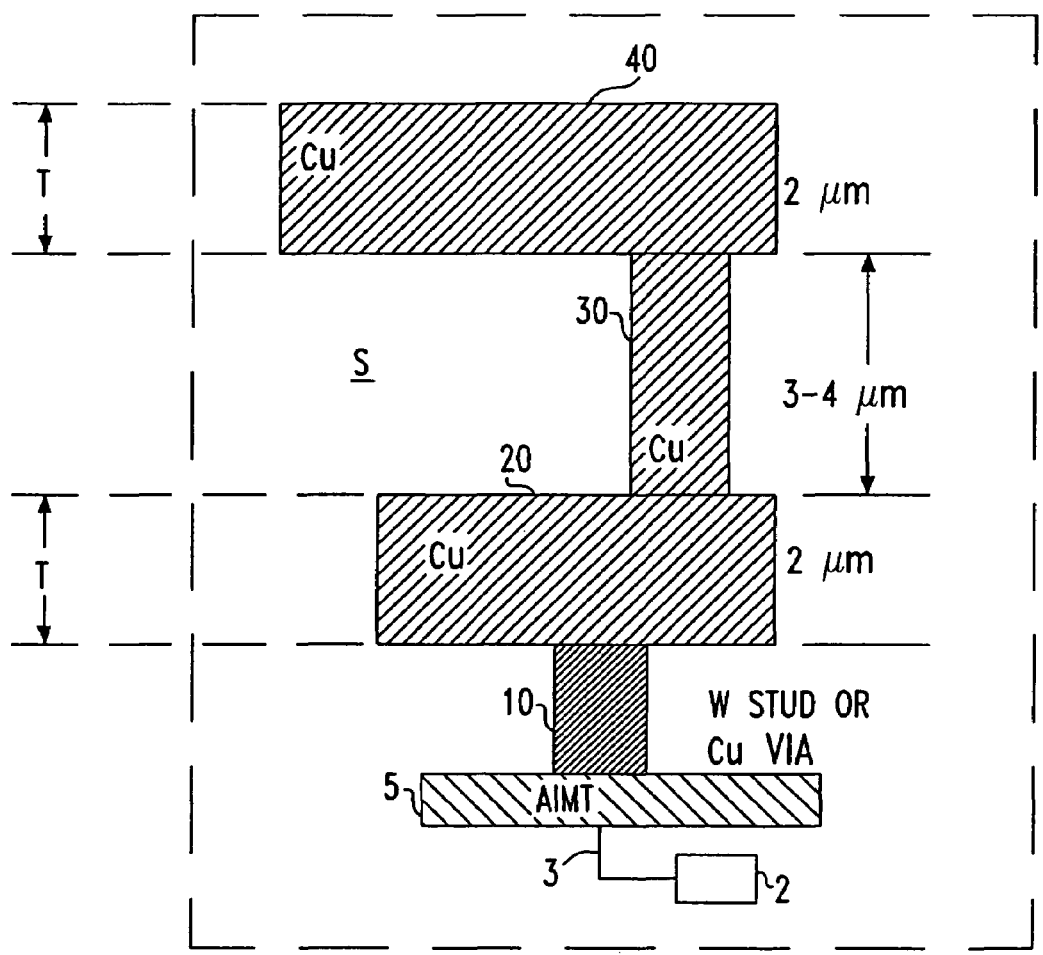
FIG. 1 is a side schematic view, partly in cross-section, showing a passive electrical device 20,30,40 of the invention, connected to other integrated circuit devices 2, by means of a stud 10 and a top metal layer 5.
Figure 2:
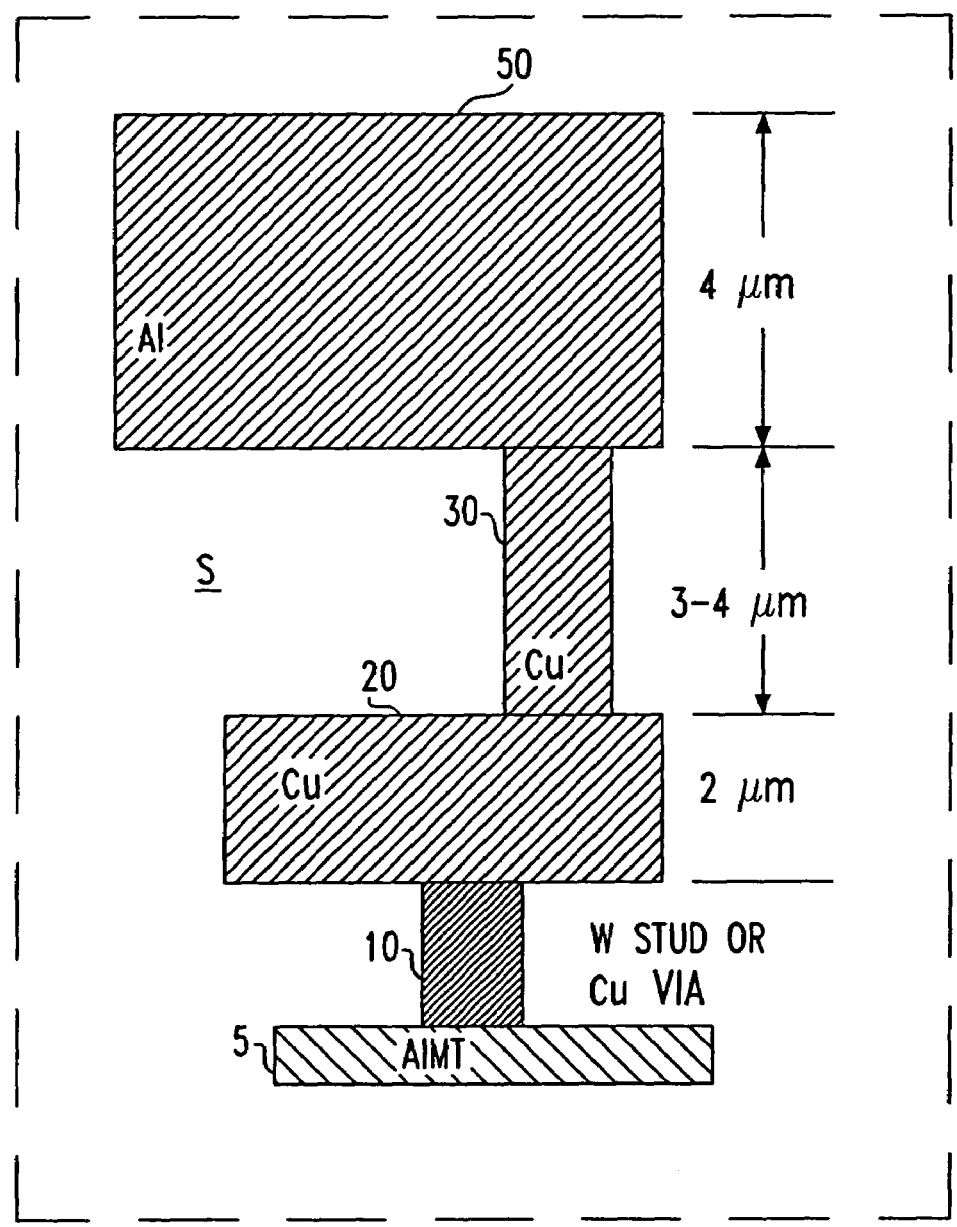
FIG. 2 is a side schematic view, partly in cross-section, similar to FIG. 1, but showing an alternative embodiment in which a second metal layer 50 is formed of a composition different from a composition of a first metal layer 20.
Figure 3B:
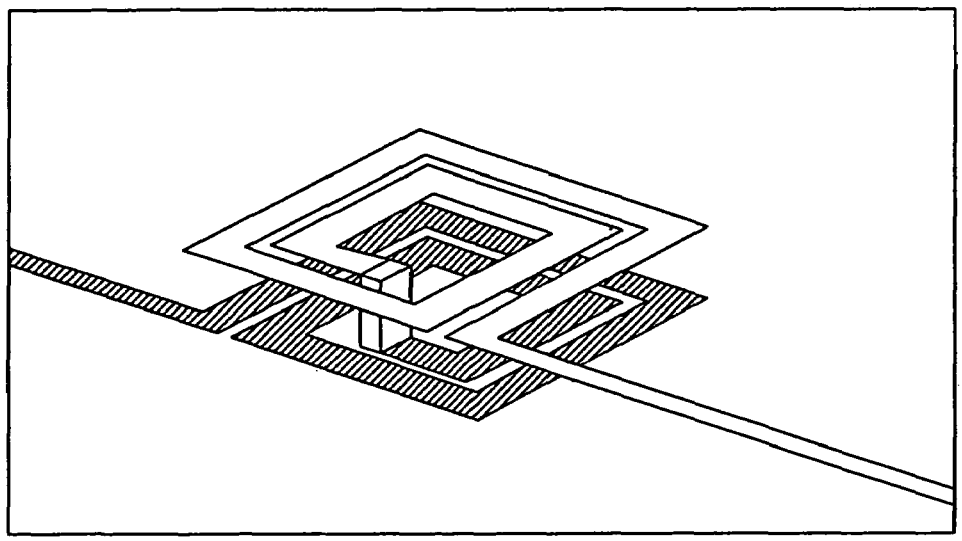
FIG. 3B shows two connected layers according to the present invention.

In one embodiment of FIGS. 1 and 3B, the sheet resistivity of the first conductor 20 and the second conductor 40 is an approx equal sheet resistivity in a range of two −10 milli ohms per square.

The electrical connection 10,5 connects the inventive device 20,30,40 to other integrated circuit elements 2 by means of a connector 3.

Various processes and techniques for forming conductors 20,30,40,50,5,10,3 and circuit elements 2 are well known, and need not be further described. See, e.g., U.S. Pat. No. 6,114,937 previously referenced.

Figure 4:
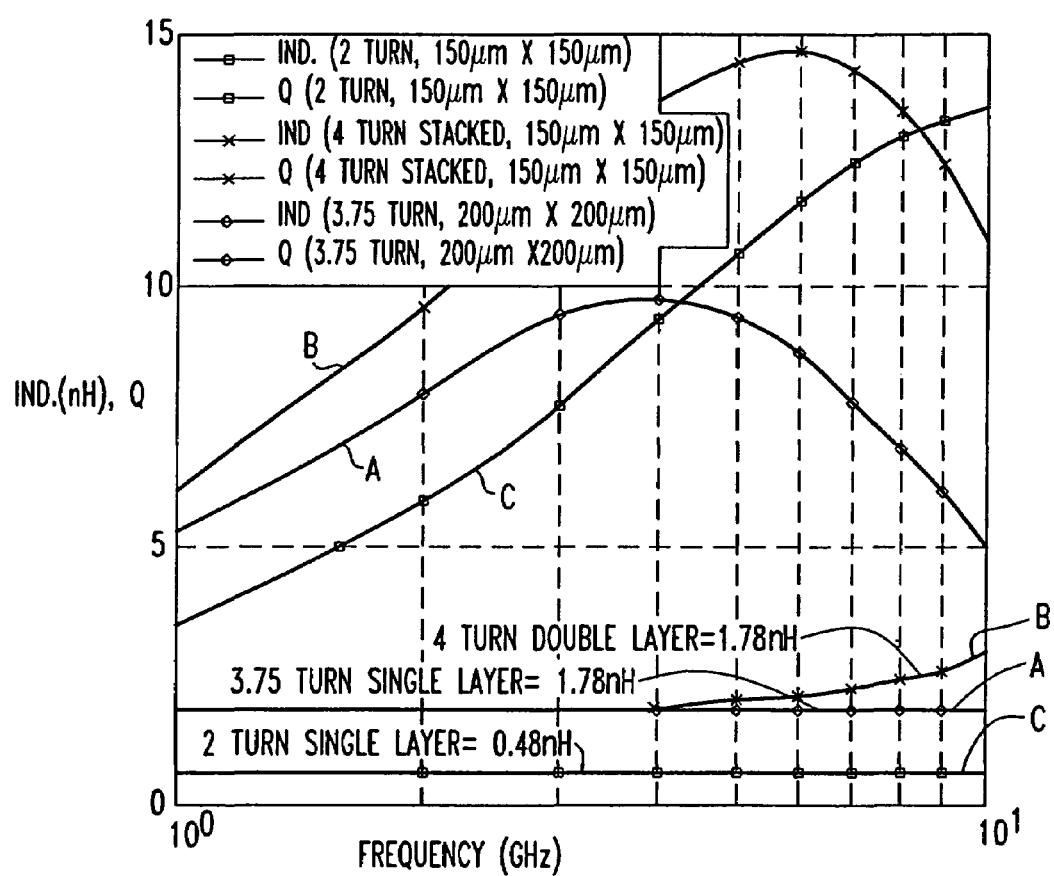
FIG. 4 is a chart of inductance and Q curves vs. frequency, which helps to explain certain properties/performances of devices according to the present invention.

FIG. 4 is a chart depicting representative inductance and Q curves vs. frequency showing the advantages inherent in stacking spiral inductors in series to achieve a high inductance density and a high Q. These curves assume approximately equal, low sheet resistivities for the two layers used in the stacked inductor according to the present invention. The two curves A indicate that an inductance of 1.78 nh can be achieved in a 200 um×200 um area when a known single layer spiral is used. The two curves B indicate that the same inductance can be achieved in about 55% of that area (150 microns×150 microns) if a series stacking scheme according to the invention is used. The curves C show that in that smaller 150 microns×150 microns area, an inductance of only 0.48 nh can be achieved using a single layer spiral (this is approximately 27% of the inductance achievable in the 150 microns×150 microns area with a series stacking arrangement according to the invention). For the two curves with comparable inductances (curve A and curve B), the series stacked spiral (B) also achieves a higher Q factor than does the single layer spiral (A). This is due to an additional advantage of series stacked spirals, specifically that the upper half of the spiral is shielded from interaction with the substrate by the lower half of the spiral. This shielding effect can provide higher Q factors for series stacked spirals than those achievable with single layer spirals, especially if the two stacked spiral layers are of comparable (approximately equal), low sheet resistivities.

While there has been shown and described what is at present considered preferred embodiment of the present invention, it will be apparent to those skilled in the art that various changes and modifications may be made therein without departing from the spirit and scope of the present invention. For example, the substrate may be any known silicon, silicon-germanium, silicon-on-insulator or silicon-on-sapphire substrate. The devices of the invention are particularly useful for operation at radio frequencies (RF).

What is claimed is:

1. A passive electrical device, comprising:
   a first spiral electrical conductor;
   a second spiral electrical conductor disposed over said first electrical conductor;
   a third electrical conductor connecting said first electrical conductor to said second electrical conductor, wherein said first spiral, second spiral and third electrical conductors are disposed on a semiconductor substrate and wherein the resistivity of said first spiral electrical conductor is approximately equal to the resistivity of said second spiral electrical conductor, and wherein said third electrical conductor has a thickness which separates said first electrical conductor from said second electrical conductor by a distance in a range of approximately three microns to approximately four microns and consists essentially of one substantially uniform chemical composition, wherein said second spiral electrical conductor occupies an area of not greater than 150 microns×150 microns, wherein said first and said second spiral electrical conductors have a coefficient of coupling of approximately 0.9 and wherein said device has an inductance of approximately 1.78 nh.

2. The device as claimed in claim 1, wherein each of said first, second and third electrical conductors has a respective thickness, and the thickness of said first electrical conductor is approximately equal to the thickness of the second electrical conductor.

3. The device as claimed in claim 1, wherein each of said first, second and third electrical conductors has a respective thickness, the thickness of said first electrical conductor being approximately equal to the thickness of the second electrical conductor anti being approximately one-half the thickness of said third conductor.

4. The device as claimed in claim 1, wherein said first, second and third electrical conductors consist essentially of copper.

5. The device as claimed in claim 1, wherein said first and third electrical conductors consist essentially of copper, and said second electrical conductor consists essentially of aluminum.

6. The device as claimed in claim 5, wherein said second electrical conductor has a substantially uniform thickness in a range of approximately four microns to approximately six microns.

7. The device as claimed in claim 1, wherein each of said first and said second electrical conductors has a respective thickness in a range of approximately two to approximately 32 microns.

8. An inductor, comprising:
   a semiconductor substrate; first spiral, second spiral and third electrical conductors provided on said substrate, wherein said first spiral and second spiral electrical conductors each has a resistivity which is approximately equal, and wherein said semiconductor substrate comprises silicon, and wherein said third electrical conductor has a thickness which separates said first electrical conductor from said second electrical conductor by a distance in a range of approximately three microns to approximately four microns and consists essentially of one metal having a substantially uniform chemical composition, wherein said second spiral electrical conductor occupies an area of not greater than 150 microns×150 microns, wherein said first and said second spiral electrical conductors have a coefficient of coupling of approximately 0.9 and wherein said device has an inductance of approximately 1.78 nh.

9. The inductor as claimed in claim 8, wherein said substrate comprises silicon and germanium.

10. The inductor as claimed in claim 8, wherein said substrate is a silicon on insulator substrate.

11. The inductor as claimed in claim 8, wherein said substrate is a silicon-on-sapphire substrate.

12. The inductor as claimed in claim 8, wherein said second electrical conductor is disposed over said first electrical conductor.

* * * * *